United States Patent
Burg

(10) Patent No.: US 9,391,624 B1
(45) Date of Patent: Jul. 12, 2016

(54) METHOD AND APPARATUS FOR AVOIDING DEAD ZONE EFFECTS IN DIGITAL PHASE LOCKED LOOPS

(71) Applicant: Marvell International Ltd., Hamilton (BM)

(72) Inventor: Olivier Burg, Lausanne (CH)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 14/746,472

(22) Filed: Jun. 22, 2015

(51) Int. Cl.
*H03L 7/085* (2006.01)
*H03L 7/18* (2006.01)
*H03L 7/197* (2006.01)
*H03L 7/099* (2006.01)
*H03L 7/091* (2006.01)

(52) U.S. Cl.
CPC ............. *H03L 7/0991* (2013.01); *H03L 7/085* (2013.01); *H03L 7/091* (2013.01); *H03L 7/18* (2013.01); *H03L 7/1974* (2013.01); *H03L 2207/50* (2013.01)

(58) Field of Classification Search
CPC ............. H03L 7/00; H03L 7/06; H03L 7/08; H03L 7/085; H03L 7/091; H03L 7/0991; H03L 7/146; H03L 7/148; H03L 7/18; H03L 7/197; H03L 7/1974; H03L 7/1976; H03L 2207/50
USPC ....................... 327/147, 156; 331/16, 17, 172; 375/373, 376
See application file for complete search history.

(56) References Cited

U.S. PATENT DOCUMENTS

| | | | | |
|---|---|---|---|---|
| 5,727,038 A * | 3/1998 | May | ..................... | H03D 13/004 331/25 |
| 7,352,297 B1 * | 4/2008 | Rylyakov | ............. | H03M 7/165 327/156 |
| 8,102,197 B1 * | 1/2012 | Zhang | ..................... | G01R 25/08 327/147 |
| 8,264,388 B1 * | 9/2012 | Cohen | ..................... | H03L 7/081 327/106 |
| 8,929,502 B2 * | 1/2015 | Endo | ..................... | H03K 23/662 327/159 |
| 8,952,763 B2 * | 2/2015 | Staszewski | .......... | H03C 3/0958 332/127 |
| 2002/0033737 A1 * | 3/2002 | Staszewski | ............. | H03L 7/093 331/17 |
| 2006/0279365 A1 * | 12/2006 | Camuffo | ................ | H03L 7/093 331/16 |
| 2010/0315140 A1 * | 12/2010 | Mayer | ..................... | H03L 7/093 327/159 |
| 2011/0140747 A1 * | 6/2011 | Endo | ....................... | H03L 7/099 327/156 |
| 2012/0328065 A1 * | 12/2012 | Burg | ....................... | H03L 7/113 375/376 |
| 2013/0113528 A1 * | 5/2013 | Frantzeskakis | ........... | H03L 7/10 327/117 |
| 2014/0266341 A1 * | 9/2014 | Jang | ........................ | H03L 7/085 327/156 |

* cited by examiner

*Primary Examiner* — Levi Gannon

(57) ABSTRACT

Embodiments include a method comprising: receiving a reference clock signal; generating, by a digitally controlled oscillator, an output signal, wherein the reference clock signal has a first frequency, and wherein the digitally controlled oscillator is configured to generate the output signal at a second frequency; based on the output signal, generating a first feedback signal, wherein the first feedback signal is representative of a phase of the output signal relative to the reference clock signal; based on the first feedback signal, generating a second feedback signal, wherein generating the second feedback signal comprises, in response to the second frequency being an integer multiple of the first frequency, modifying the first feedback signal to generate the second feedback signal; and based on the second feedback signal, generating a control signal, wherein the output signal is generated by the digitally controlled oscillator based on the control signal.

18 Claims, 6 Drawing Sheets

METHOD AND APPARATUS FOR AVOIDING DEAD ZONE EFFECTS IN DIGITAL PHASE LOCKED LOOPS

CROSS REFERENCE TO RELATED APPLICATIONS

This disclosure claims priority to U.S. Provisional Patent Application No. 62/017,421, filed on Jun. 26, 2014, which is incorporated herein by reference in its entirety.

TECHNICAL FIELD

Embodiments of the present disclosure relate to digital phase locked loops, and in particular to avoiding dead zone effects in a digital phase locked loop.

BACKGROUND

Various radio frequency synthesizers are known for use in various devices, such as transceivers. A radio frequency synthesizer receives a reference clock signal, and generates an oscillating signal. The radio frequency synthesizer includes a digital phase locked loop for generating the oscillating signal. A time to digital converter (TDC) of the radio frequency synthesizer determines a phase difference between the oscillating signal and the reference signal, and generates a feedback, based on which the oscillating signal is generated. A static feedback from the TDC, due to a finite resolution of the TDC, can contribute to increased phase noise and decreased performance of the radio frequency synthesizer.

SUMMARY

In various embodiments, the present disclosure provides a method comprising: receiving a reference clock signal; generating, by a digitally controlled oscillator, an output signal, wherein the reference clock signal has a first frequency, and wherein the digitally controlled oscillator is configured to generate the output signal at a second frequency; based on the output signal, generating a first feedback signal, wherein the first feedback signal is representative of a phase of the output signal relative to the reference clock signal; based on the first feedback signal, generating a second feedback signal, wherein generating the second feedback signal comprises, in response to the second frequency being an integer multiple of the first frequency, modifying the first feedback signal to generate the second feedback signal; and based on the second feedback signal, generating a control signal, wherein the output signal is generated by the digitally controlled oscillator based on the control signal.

In various embodiments, the present disclosure also provides a system configured to receive a reference clock signal, the system comprising: a digitally controlled oscillator configured to generate an output signal, wherein the reference clock signal has a first frequency, and wherein the digitally controlled oscillator is configured to generate the output signal at a second frequency; and a digital processor comprising (i) a feedback modification module and (ii) a control module, wherein the feedback modification module is configured to: receive a first feedback signal, wherein the first feedback signal is representative of a phase of the output signal relative to the reference clock signal, and based on the first feedback signal, generate a second feedback signal, wherein the feedback modification module is configured to generate the second feedback signal by in response to the second frequency being an integer multiple of the first frequency, modifying the first feedback signal to generate the second feedback signal, and wherein the control module is configured to, based on the second feedback signal, generate a control signal, wherein the digitally controlled oscillator is configured to generate the output signal based on the control signal.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Various embodiments are illustrated by way of example and not by way of limitation in the figures of the accompanying drawings.

DETAILED DESCRIPTION

Figure 1:
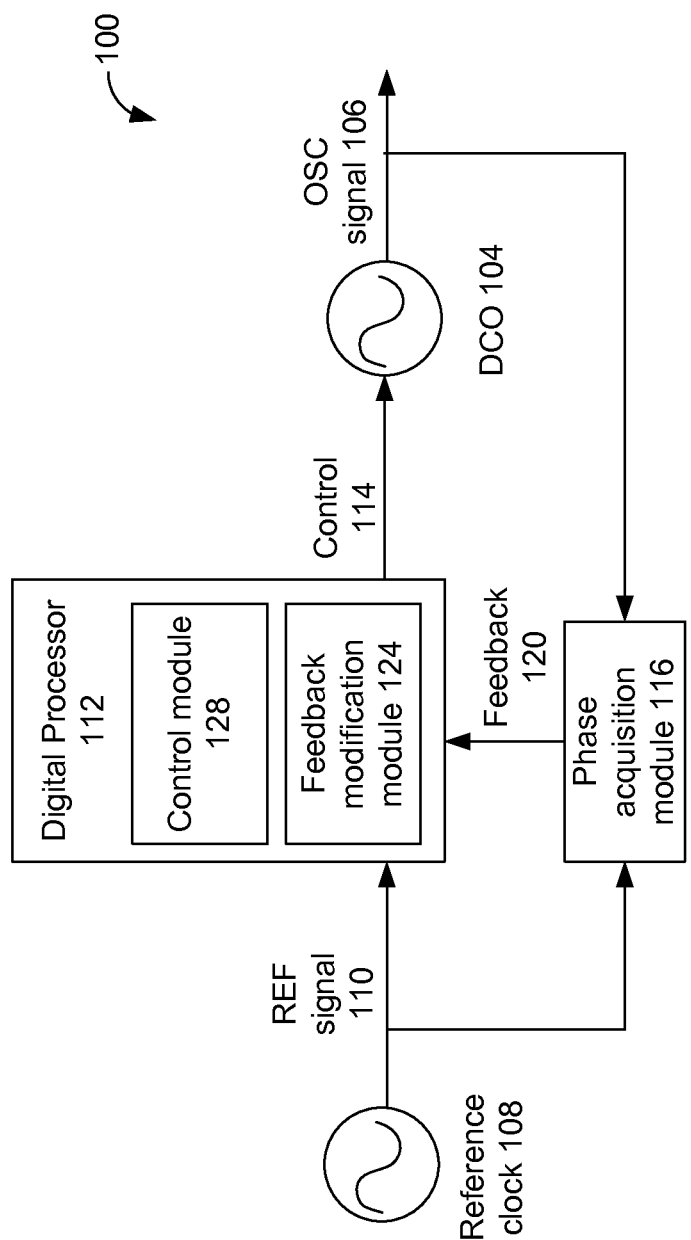
FIG. 1 schematically illustrates a digital phase locked loop system, in accordance with an embodiment.

FIG. 1 schematically illustrates a digital phase locked loop system 100 (henceforth referred to as "system 100"), in accordance with an embodiment. The system 100, for example, is an all digital phase locked loop (ADPLL). In an embodiment, the system 100 generates an oscillating signal 106 (henceforth referred to as "OSC signal 106") in response to a reference clock signal 110 (henceforth referred to as "REF signal 110").

In an embodiment, the REF signal 110 is generated by a reference clock 108. Although FIG. 1 illustrates the reference clock 108 to be included in the system 100, in another embodiment (and although not illustrated in FIG. 1), the reference clock 108 is external to the system 100. That is, in such an embodiment, the system 100 receives the REF signal 110 from an external source.

The system 100 comprises a digitally controlled oscillator (DCO) 104, a digital processor 112, and a phase acquisition module 116 (henceforth referred to as "module 116"). In an embodiment, the DCO 104 generates the OSC signal 106. In an embodiment, the module 116 receives the OSC signal 106 and the REF signal 110, and generates a feedback signal 120 (henceforth referred to as "feedback 120"). The digital processor 112 receives the feedback 120 and the REF signal 110, and generates a control signal 114. The DCO 104 generates the OSC signal 106, in response to the control signal 114. In an embodiment, the system 100 comprises a phase locked loop that determines a time difference between the REF signal 110 and a feedback of the OSC signal 106 (i.e., the feedback 120), to generate the OSC signal 106.

In an embodiment, the digital processor 112 comprises a feedback modification module 124 configured to selectively modify the feedback 120 (e.g., based on an operating mode of the system 100). In an embodiment, selectively modifying the feedback 120 ensures avoiding a dead zone effect in the system 100, as will be discussed in more detail herein later. In an embodiment, the digital processor 112 further comprises a control module 128 to generate the control signal 114, e.g., based on the modified feedback generated by the feedback modification module 124.

Assume that a frequency of the OSC signal 106 is Fosc, and a frequency of the REF signal 110 is Fref. In an embodiment, the frequencies of the OSC signal 106 and the REF signal 110 are related as follows:

$$Fosc = N*Fref, \qquad \text{Equation 1}$$

where "N" is a positive, real number. The term "N" is also referred to herein as a multiplication factor. As an example, the multiplication factor N is expressed as:

$$N = Nint + Nfrac. \qquad \text{Equation 2}$$

The term Nint in equation 2 represents an integer component of the multiplication factor N, and the term Nfrac represents a decimal component of the multiplication factor N. If, for example, Nfrac=0, then the multiplication factor N becomes an integer.

Figure 2:
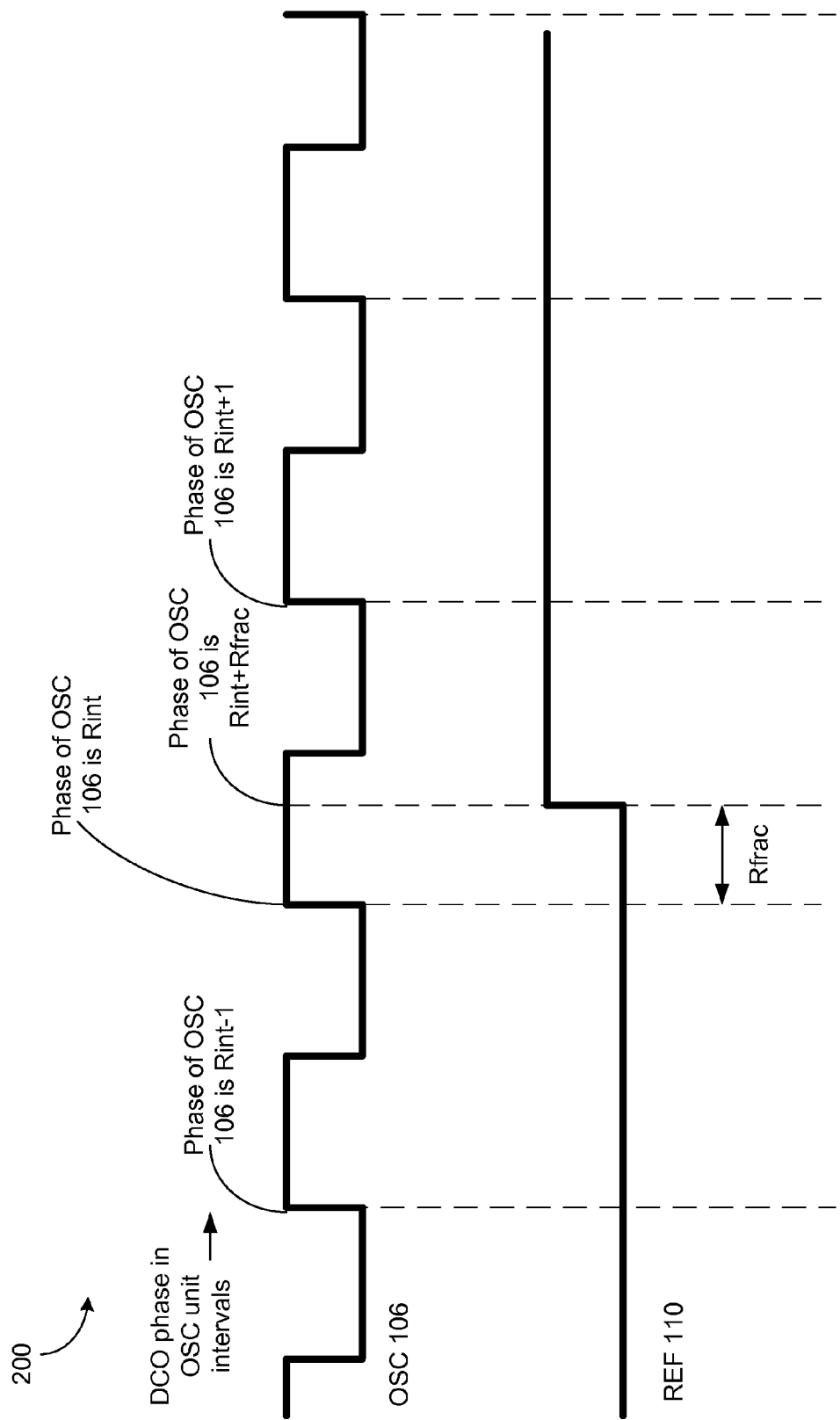
FIG. 2 illustrates a timing diagram of an oscillating signal and a reference clock signal, in accordance with an embodiment.

FIG. 2 illustrates a timing diagram 200 of the OSC signal 106 and the REF signal 110, in accordance with an embodiment. The timing diagram 200 illustrates a plurality of cycles of the OSC signal 106, and a transition of the REF signal 110. The frequency Fosc is a multiple of the frequency Fref, as discussed with respect to equations 1 and 2. Accordingly, a single cycle of the REF signal 110 includes a plurality of cycles of the OSC signal 106. Merely as an example, the frequency Fosc is in the range of 1.1 to 1.5 GHz, and the frequency Fref is 100 MHz.

Assume, for example, that within a single cycle of the REF signal 110, there are (i) Nint number of full cycles of the OSC signal 106 and (ii) a fractional cycle Nfrac of the OSC signal 106. Accordingly, a phase of the OSC signal 106 with respect to the REF signal 110 is (Rint+Rfrac), wherein Rint and Rfrac are measured in unit intervals of the cycles of the OSC signal 106. Rfrac represents a fractional phase of the OSC signal 106. The fractional phase Rfrac of the OSC signal 106 is illustrated in the timing diagram 200 of FIG. 2.

In an embodiment, a phase of the DCO 104 is represented as Rdco (expressed in unit intervals of cycles of the OSC signal 106), as follows:

$$Rdco = Rint + Rfrac. \qquad \text{Equation 3}$$

Figure 3:
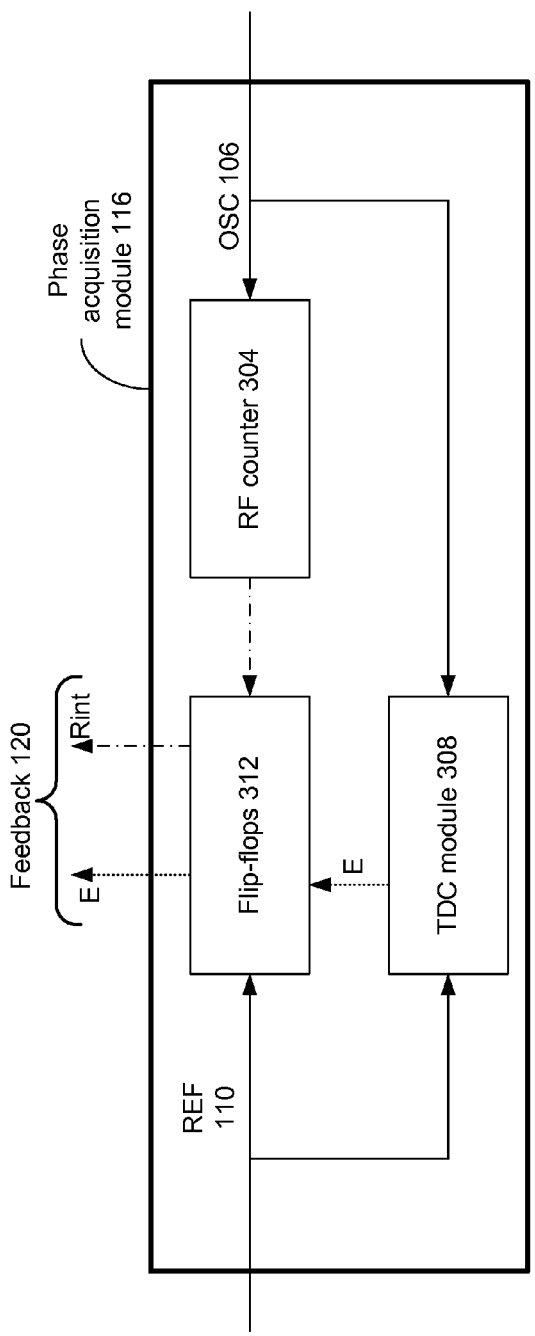
FIG. 3 schematically illustrates a phase acquisition module of the system of FIG. 1, in accordance with an embodiment.

FIG. 3 schematically illustrates the module 116 of the system 100 of FIG. 1 in more detail, in accordance with an embodiment. In an embodiment, the module 116 measures the phase of the OSC signal 106 at the clock rate of the REF signal 110.

In an embodiment, the module 116 comprises a time to digital converter (TDC) module 308, a radio-frequency (RF) counter 304, and a plurality of flip-flops 312. In an embodiment, the RF counter 304 receives the OSC signal 106. The RF counter 304 outputs a count, which is incremented at every clock cycle of the OSC signal 106 (e.g., incremented at every rising edge of the OSC signal 106). The flip-flops 312 receive the count that is output by the RF counter 304. The flip-flops 312 also receive the REF signal 110, and are clocked by the REF signal 110. The flip-flops 312 keep a track of the count that is output by the RF counter 304, and outputs Rint at every rising edge of the REF signal 110. Thus, for example, the Rint output by the flip-flops 312 comprises a number of rising edges of the OSC signal 106 for each clock cycle of the REF signal 110. As discussed with respect to equation 3, the Rint provides a coarse value (e.g., the decimal component) of the phase Rdco of the DCO 104. It is to be noted that the count value of the RF counter 304 (illustrated using dashed and dotted line) is periodically output by the flip-flops 312 as Rint (also illustrated using dashed and dotted line). The flip-flops 312 and the RF counter 304, for example, can have structures that are well known to those skilled in the art, and hence, a more detailed description of these components are not provided herein.

In an embodiment, the TDC module 308 receives the OSC signal 106 and the REF signal 110, and outputs a value E. The flip-flops 312 propagate the value E to the digital processor 112. In an embodiment, the value E is representative of the fractional phase Rfrac of equation 3. In an embodiment, the values E and Rint, output by the flip-flops 312, form the feedback 120 of FIG. 1.

Figure 4:
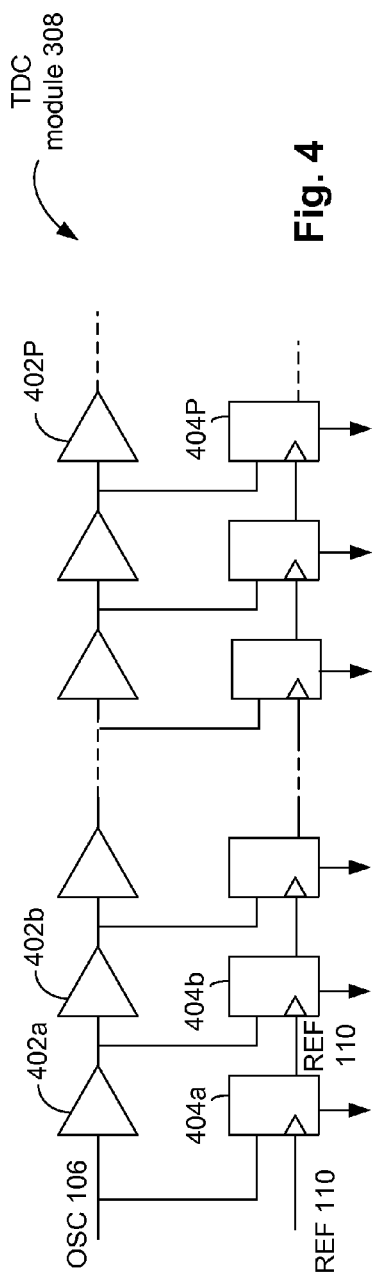
FIG. 4 schematically illustrates a TDC module of the system of FIG. 1, in accordance with an embodiment.

FIG. 4 schematically illustrates the TDC module 308 of FIG. 3 in more detail, in accordance with an embodiment. In an embodiment, the TDC module 308 comprises a delay chain formed by a series of delay circuits 402a, . . . , 402P. Each delay circuit 402 has a delay Td, which is a resolution of the TDC module 308. The delay circuit 402a receives the OSC signal 106, delays the OSC signal 106 by the delay Td, and passes the delayed signal to the delay circuit 402b, and the process continues, as illustrated in FIG. 4.

The TDC module 308 also comprises a series of cascaded flip-flops 404a, . . . , 404P. An output of each delay circuit is coupled to a respective input of a corresponding flip-flop 404. The REF signal 110 clocks flip-flops 404. The outputs of the flip-flops 404 form the value E of FIG. 3.

Figure 5:
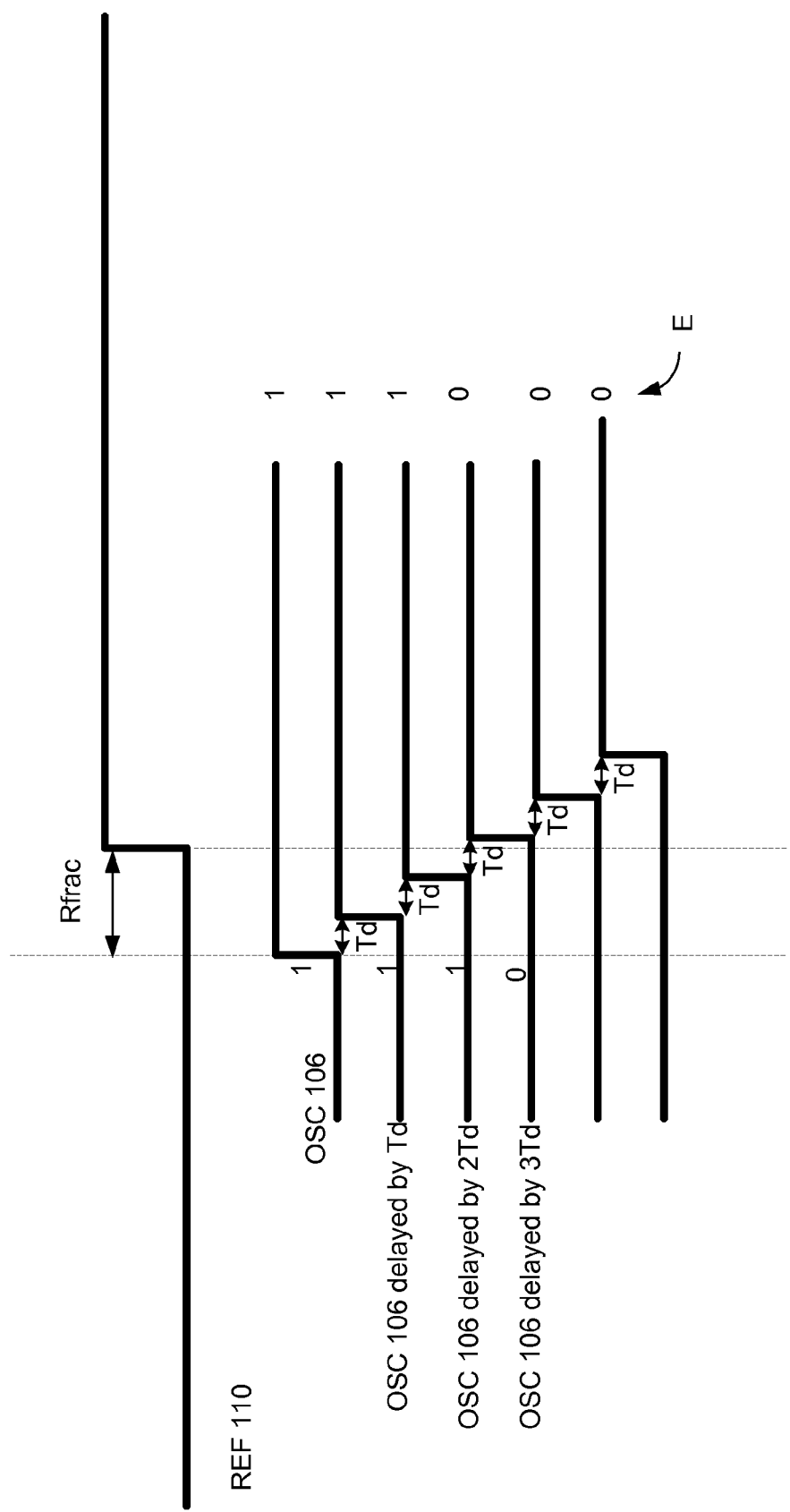
FIG. 5 illustrates a graph showing a relationship between a reference clock signal, an oscillating signal, and an output of a TDC module, in accordance with an embodiment.

FIG. 5 illustrates a graph showing the relationship between the REF signal 110, the OSC signal 106, the delayed versions of the OSC signal 106 (e.g., as delayed by the delay circuits 402), and the value E output by the TDC module 308, according to one embodiment. In an embodiment, the delay circuits 402 determine the number of delays Td for the fractional phase Rfrac.

For each delayed version of the OSC signal 106 having a rising edge prior to the rising edge of the REF signal 110, the corresponding flip-flop 404 outputs a value "1". For example, in the illustrative example of FIG. 4, each of the flip-flops 404a, 404b and 404c outputs the value "1," and the remaining of the flip-flops 404 output the value "0." Accordingly, the sampled value E of the TDC module 308 is 111000 . . . , where the number of 1's is representative of the fractional phase Rfrac of the OSC signal 106. In an embodiment, the value E from the TDC module 308 is a positive integer value. In an example, a number of 1's in the value E from the TDC module 308 is representative of a number of time delays Td between a rising edge of the OSC signal 106 and the REF signal 110, as illustrated in FIG. 5.

In an embodiment, the fractional phase Rfrac of the OSC signal 106 is represented by:

$$Rfrac = E*Td*Fosc. \qquad \text{Equation 4}$$

In an embodiment, the equation 4 is implemented in the digital processor 112. For example, the digital processor 112 determines a value NORM, as follows:

$$NORM = Td*Fosc. \qquad \text{Equation 5}$$

Once the NORM is determined by the digital processor 112, the value of NORM does not usually change (e.g., unless, for example, the frequency Fosc of the OSC signal 106 changes). Subsequently, the digital processor 112 determines the Rfrac as follows:

$$Rfrac = NORM*E. \qquad \text{Equation 6}$$

The TDC module 308 has a finite phase resolution. For example, a phase resolution of the TDC module 308 is represented by Td/Tosc, where Tosc is a time period of the OSC signal 106. Thus, TDC module 308 acquires fractional phase information with a quantization error. The quantization error is a phase noise source that can be low-pass filtered with noise from the REF signal 110. Because the system 100 comprises an all digital phase locked loop, the quantization error of the TDC module 308 is a major in-band phase noise contributor to the system 100 at the output of the DCO 104.

Figure 6:
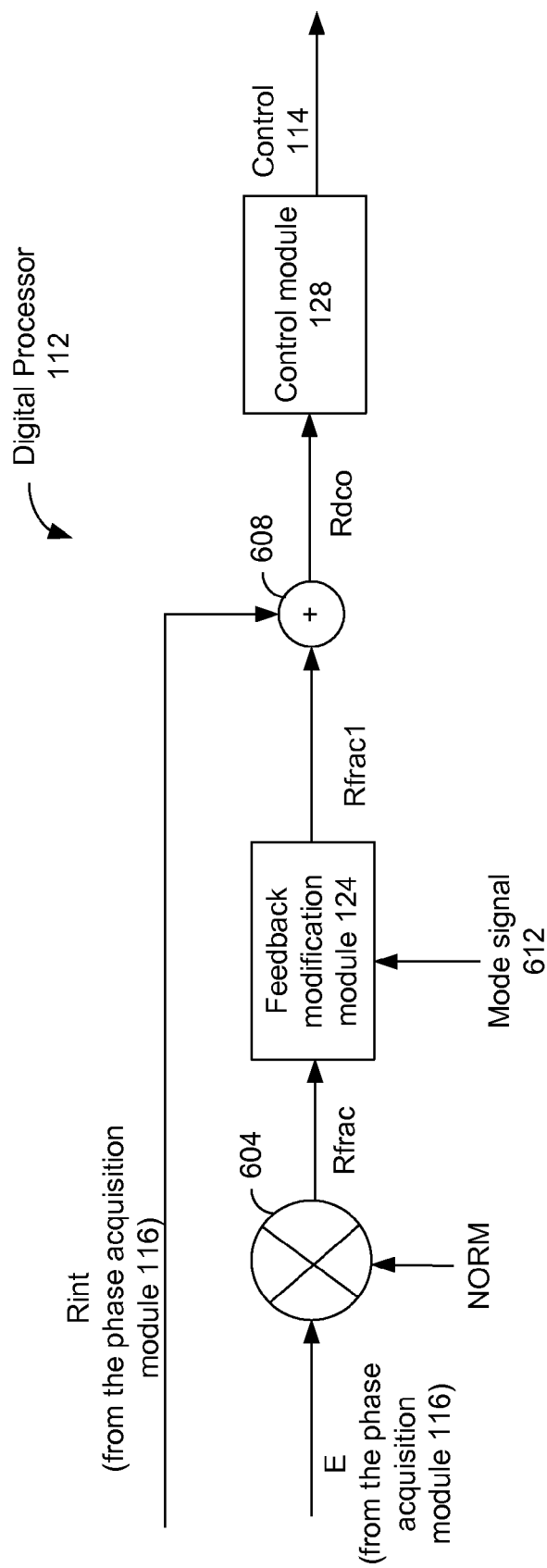
FIG. 6 schematically illustrates a digital processor of the system of FIG. 1, in accordance with an embodiment.

FIG. 6 schematically illustrates the digital processor 112 of FIG. 1 in more detail, in accordance with an embodiment. In an embodiment, the digital processor 112 receives the values E and Rint from the module 116 (e.g., as feedback 120). A multiplier 604 of the digital processor 112 multiplies the value E with NORM (which is generated based on equation 5) to generate Rfrac, as discussed with respect to equations 5 and 6.

In an embodiment, the Rfrac generated by the multiplier 604 is selectively processed by the feedback modification module 124 to generate Rfrac1. In an embodiment, the feedback modification module 124 receives a mode signal 612, which is indicative of an operational mode of the system 100. In an embodiment, while the system 100 operates in a first mode, the feedback modification module 124 modifies Rfrac to generate Rfrac1; and while the system 100 operates in a second mode, Rfrac1 and Rfrac are the same (i.e., in the second mode, no modification of Rfrac is performed by the feedback modification module 124), as will be discussed in more detail herein later. Thus, Rfrac1 represents either the fractional phase Rfrac or a modified version of the fractional phase Rfrac. Rfrac1 is also referred to herein as a processed fractional phase of the OSC signal 106.

In an embodiment, the digital processor 112 comprises an added 608, which adds the integer phase Rint and the processed fractional phase Rfrac1, to generate a phase of the DCO 104. For example, $$Rdco = Rfrac1 + Rint. \quad \text{Equation 7}$$

In an embodiment, the Rdco is used by the control module 128 of the digital processor 112 to generate the control signal 114.

As discussed with respect to equation 1, a single cycle of the REF signal 110 includes N cycles of the OSC signal 106, where N is a positive, real number. In an embodiment, assume $0, 1, \ldots, (k-1), k, (k+1), \ldots$, samples of the Rdco is sampled by the digital processor 112, and the sampling is performed at the rate of the REF signal 110. In an embodiment, the Rdco is incremented by N between two samples, i.e., $$Rdco(k+1) = Rdco(k) + N. \quad \text{Equation 8}$$

As discussed with respect to equations 1 and 2, N is a positive number that has an integer part and a decimal part. Assume a scenario where the decimal part of N is zero (i.e., Nfrac of equation 2 is zero). In such a case, the frequency Fosc is an integer multiple of the frequency Fref. Such an operation of the system 100 (i.e., when N is an integer) is also referred to herein as an "integer mode" of operation of the system 100. On the other hand, if N has a non-zero decimal (i.e., Nfrac of equation 2 is non-zero), the operation of the system 100 is referred to herein as a "non-integer mode" of operation.

Assume that the system 100 is operating in the integer mode and the feedback modification module 124 is non-operational (i.e., Rfrac1=Rfrac). Accordingly, Nfrac is zero, and Rfrac has a static value that does not change with time. Merely as an example, assume Fref is 1 MHz and N is 100, i.e., the system 100 operates in the integer mode. Accordingly, Fosc is 100 MHz. Also, Rdco in a given sample is 100 unit intervals higher than the previous sample. Also, assume Rdco(0) represents the first sampled value of Rdco. For example, during an initialization of the system 100, Rdco(0) can be an arbitrary number, say 20.5 (i.e., Rint(0) is 20, and Rfrac(0) is 0.25). Also, assuming that the system 100 stabilizes by the second reference clock cycle, Rdco(1) will be 120.25, Rdco(2) will be 220.25, Rdco(3) will be 320.25, and so on (e.g., because N=100). That is, when the system 100 operates in the integer mode and assuming that the feedback modification module 124 is non-operational (i.e., Rfrac1=Rfrac), the fractional part of the Rdco (i.e., Rfrac) will be static (i.e., does not change with each cycle of the REF signal 110) and the value E will also be static.

In contrast, the fractional part of the Rdco (i.e., Rfrac) varies with each reference clock cycle when the system 100 operates in the non-integer mode. For example, assume that Fref is 1 MHz, N is 100.1 (i.e., the system 100 operates in the non-integer mode), and Fosc is 100.1 MHz. Also assume that Rdco(0) is 20.25. Accordingly, assuming that the system 100 stabilizes by the second reference clock cycle, Rdco(1) will be 120.35, Rdco(2) will be 220.45, Rdco(3) will be 320.55, and so on (e.g., because N is 100.1). That is, when the system 100 operates in the non-integer mode, the fractional part of the Rdco (i.e., Rfrac) varies with each reference clock cycle.

Assume that the system 100 is operating in the integer mode and the feedback modification module 124 is non-operational (i.e., Rfrac1=Rfrac). Thus, the value E output by the TDC module 308 can potentially be static for at least the reasons discussed herein above. In an example, a potential static output of the TDC module 308 means that the phase of the DCO 104 can wander within the quantization resolution of the TDC module 308, until a perturbation (such as noise, temperature drift, etc.) makes the fractional phase cross the next (or the previous) delay interval Td of the TDC module 308. This means that the phase locked loop of the system 100 exhibits a "dead zone" behavior, and that the phase locked loop of the system 100 can for a while not update the feedback to the DCO 104 (i.e., not change the control signal 114). This corresponds to the PLL loop being open. This is a concern in terms of noise performance of the system 100. For example, for an inside loop bandwidth of the phase locked loop of system 100, the phase noise is determined by the quantization noise of the TDC module 308. For outside the loop bandwidth of the phase locked loop of system 100, the phase noise is determined by the phase noise of the DCO 104. In an example, the phase locked loop of system 100 cancels the phase noise inside the loop bandwidth, and the loop bandwidth is usually chosen for optimum or near optimum integrated phase noise performance. However, when the phase locked loop is broken or opened because of the "dead zone" behavior, there is no more cancellation of the DCO phase noise, thereby leading to close-in phase noise degradation. For example, spectrally the phase noise profile can wander between an expected response and the response of the DCO 104, thereby leading to a degradation of integrated phase noise of the system 100.

In an embodiment, when the system 100 operates in the integer mode (e.g., as indicated by the mode signal 612), the feedback modification module 124 modifies the Rfrac to generate Rfrac1. For example, assume that an average value of the fractional phase Rfrac1, over a number of clock cycles of the REF signal 110, is forced by the digital processor 112 of the system 100 to a target value Rfrac_avg. That is, digital processor 112 controls the Rfrac1 such that the average value of the fractional phase Rfrac1 is substantially equal to the target value Rfrac_avg. That is, if the feedback modification module 124 does not modify the Rfrac, then assume that the fractional phrase Rfrac converges to Rfrac_avg. For example, in the previously discussed example where Fref is 1 MHz, N is 100, Fosc is 100 MHz, and Rdco(0) is 20.25, the Rfrac_avg will be about 0.25. The phase locked loop of the system 100 targets to maintain the fractional phrase of the OSC signal 106 at 0.25.

In an embodiment, when the system 100 operates in the integer mode (and assuming that the feedback modification module 124 is operational), the feedback modification module 124 modifies the Rfrac so that Rfrac1 toggles between two values, and so that the average value of Rfrac1 is still substantially equal to Rfrac_avg. For example, in the previously discussed example where Rfrac_avg is 0.25, Rfrac1 is toggled between 0.24 and 0.26, so that the average value of the Rfrac1 is still substantially equal to 0.25. Also, the toggling of Rfrac results in toggling of value E output by the TDC module 308 as well (e.g., because from equation 6, NORM being constant, Rfrac can only toggle if E toggles as well). Furthermore, the toggling of value E output by the TDC module 308 prevents the DCO 104 to wander within the resolution of the TDC module 308, thereby avoiding the dead zone and ensuring that the phase locked loop is closed.

On the other hand, while the system 100 is operating in the non-integer mode, the fractional phase Rfrac varies with time due to the non-zero decimal portion of N (i.e., as Nfrac of equation 2 is non-zero). The variation of the fractional phase Rfrac ensures that the phase locked loop is closed, and dead zone is avoided. Accordingly, while the system 100 is operating in the non-integer mode (e.g., as indicated by the mode signal 612), the feedback modification module 124 does not modify the fractional phase Rfrac, and in such a case, Rfrac1=Rfrac.

In an embodiment, while the system 100 is operating in the integer mode, the modification of the fractional phrase Rfrac by the feedback modification module 124 can be performed in any appropriate manner. As an example, assume that Rfrac is represented by F number of bits, where F is an appropriate integer. Assume, for example, that F is seven (that is, Rfrac is transmitted by a seven bit bus). Also assume that Rfrac_avg is 0.25. Then the average fractional phase Rfrac_ave is represented by $0.25*2^7$, i.e., 32 (in decimal notation) in the bus of Rfrac. In binary notation, Rfrac_ave is 0100000. Note that the least significant bit (LSB) of the Rfrac_avg is zero. In an embodiment, the feedback modification module 124 forces the LSB of Rfrac to be 1. That is, if Rfrac is 0100000, then the feedback modification module 124 modifies the Rfrac such that Rfrac1 is equal to 0100001. As the average value of Rfrac1 forced by the digital processor 112 is 0100000, the control signal 114 is generated to compensate for the modification in the fractional phase. For example, in decimal notation, Rfrac_ave is 32, and the feedback modification module 124 modifies the Rfrac such that Rfrac1 is equal to 33. Due to the compensation provided by the control module 128, the fractional phase can change to, for example, 30, which is again modified by the feedback modification module 124 to 31 (e.g., by forcing the LSB of the Rfrac to 1).

Thus, for example, while the system 100 is operating in the integer mode and Rfrac_ave is represented as 32, the feedback modification module 124 forces the LSB of Rfrac1 to be 1. This results in a deviation of the fractional phrase, such that, for example, Rfrac toggles between 30, 31, 32, 33 and 34. Due to the modification performed by the feedback modification module 124, Rfrac1 toggles between 31 and 33. The average value of Rfrac1 is still 32 (e.g., due to the operation of the digital processor 112) and hence, the OSC signal 106 still accurately tracks the REF signal 110. Also, the toggling in Rfrac ensures that the dead zone in the system 100 is avoided, thereby avoiding degradation of performance by the system 100 due to such dead zone.

In an embodiment, instead of forcing the LSB of Rfrac to be 1, the feedback modification module 124 can also force the LSB of the Rfrac to be 0. For example, assume that the LSB of Rfrac_avg is 1. In such a case, the feedback modification module 124 forces the LSB of the Rfrac to be 0, which results in a toggling of the Rfrac.

In an embodiment, the feedback modification module 124 can change the Rfrac in any other appropriate manner. For example, the feedback modification module 124 can change the Rfrac in any other appropriate manner such that the value Rfrac1 can never equal the average value Rfrac_avg (forced by the system 100) in a static way, so that the average of Rfrac1 can only equal Rfrac_avg by having Rfrac toggle around Rfrac_avg over several cycles of the REF signal 100. Merely as an example, for a first time period, the feedback modification module 124 can force the LSB of Rfrac to be 1; for a second time period that follows the first time period, the feedback modification module 124 can force the LSB of Rfrac to be 0, and so on.

In another example, the feedback modification module 124 can change the LSB of Rfrac not continuously, but only intermittently (for example, not at every cycle of the REF signal 110, but at periodic or intermittent cycles of REF signal 110). For example, for every 20 cycles of the REF signal 110, the feedback modification module 124 can force the LSB of Rfrac1 to be 1 (or 0, or change Rfrac1 in another appropriate manner). Such periodic (but not continuous) modification of the Rfrac1 ensures that the dead zone is periodically broken, while the OSC signal 106 accurately tracks the REF signal 110.

Figure 7:
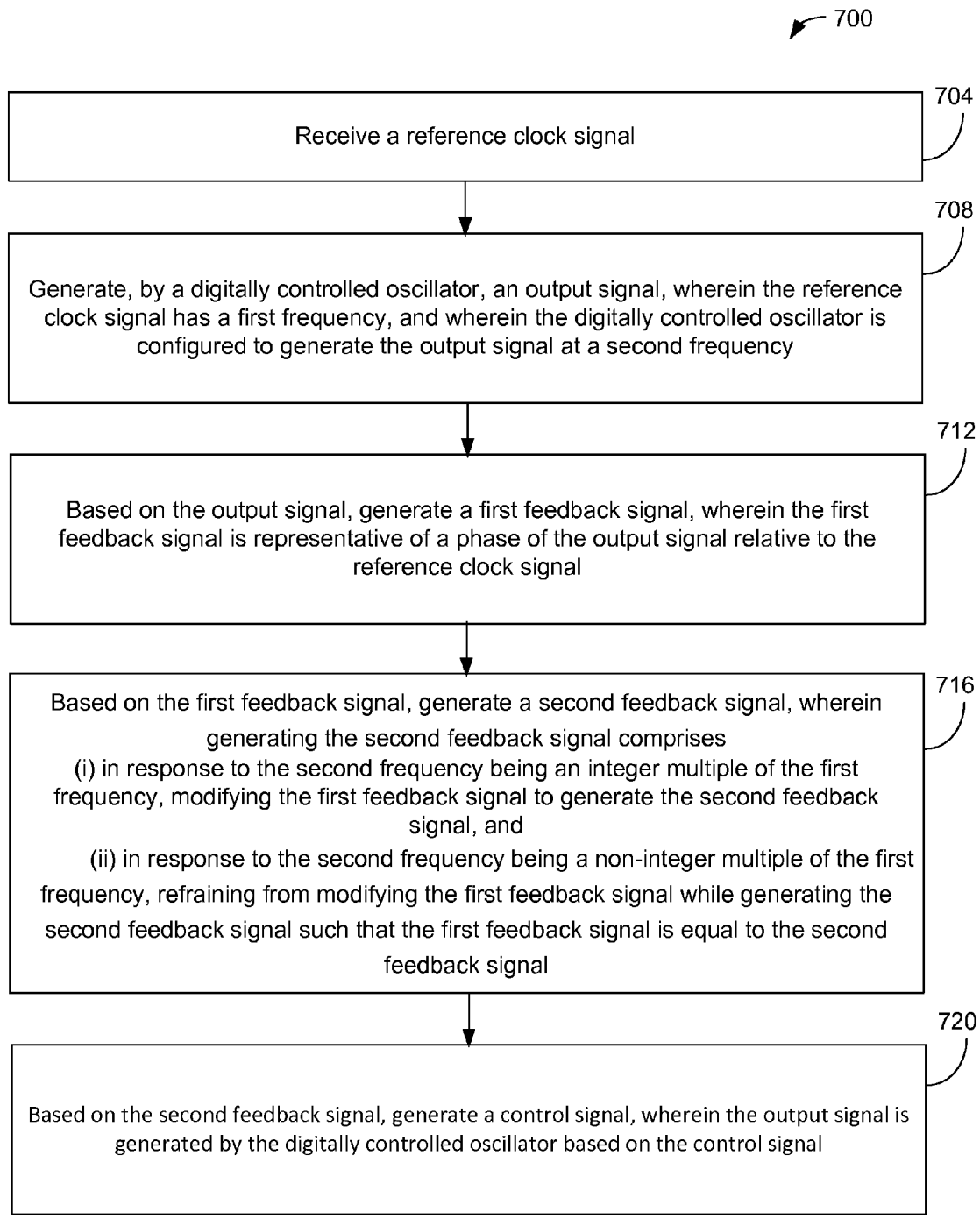
FIG. 7 illustrates a flow diagram of an example method for operating a digital phase locked loop system, in accordance with an embodiment.

FIG. 7 illustrates a flow diagram of an example method 700 for operating a digital phase locked loop system (e.g., the system 100 of FIG. 1), in accordance with an embodiment. At 704, a reference clock signal (e.g., the REF signal 110) is received by the digital phase locked loop system. In the example of FIG. 1, the reference clock signal is generated by the reference clock 108 included in the system 100, or is received from an external source.

At 708, a digitally controlled oscillator (e.g., the DCO 104 of FIG. 1) generates an output signal (e.g., the OSC signal 106 of FIG. 1). In an example, the reference clock signal has a first frequency (e.g., frequency Fref), and the digitally controlled oscillator is configured to generate the output signal at a second frequency (e.g., frequency Fosc).

At 712, based on the output signal, a first feedback signal (e.g., Rfrac of FIG. 6) is generated (e.g., by the TDC module 308 and the digital processor 112). In an embodiment, the first feedback signal is representative of a phase (e.g., the fractional Rfrac) of the output signal relative to the reference clock signal.

At 716, based on the first feedback signal, a second feedback signal is generated (e.g., by the feedback modification module 124 of FIG. 6). In an embodiment, in response to the second frequency being an integer multiple of the first frequency, the first feedback signal is modified to generate the second feedback signal. In an embodiment, in response to the second frequency being a non-integer multiple of the first frequency, the first feedback signal is not modified while generating the second feedback signal such that the first feedback signal is equal to the second feedback signal.

At 720, based on the second feedback signal, a control signal (e.g., control signal 114) is generated (e.g., by the control module 128 of FIG. 6). In an embodiment, the output signal is generated by the digitally controlled oscillator based on the control signal.

The description may use the phrases "in an embodiment," or "in embodiments," which may each refer to one or more of the same or different embodiments. The terms "comprising," "having," and "including" are synonymous, unless the context dictates otherwise. The phrase "A and/or B" means (A), (B), or (A and B). The phrase "A/B" means (A), (B), or (A and B), similar to the phrase "A and/or B." The phrase "at least one of A, B and C" means (A), (B), (C), (A and B), (A and C), (B and C) or (A, B and C). The phrase "(A) B" means (B) or (A and B), that is, A is optional.

Although certain embodiments have been illustrated and described herein, a wide variety of alternate and/or equivalent embodiments or implementations calculated to achieve the same purposes may be substituted for the embodiments illustrated and described without departing from the scope of the present invention. This application is intended to cover any adaptations or variations of the embodiments discussed herein. Therefore, it is manifestly intended that embodiments in accordance with the present invention be limited only by the claims and the equivalents thereof.

What is claimed is:

1. A method comprising:
   receiving a reference clock signal;
   generating, by a digitally controlled oscillator, an output signal, wherein the reference clock signal has a first frequency, and wherein the digitally controlled oscillator is configured to generate the output signal at a second frequency;
   based on the output signal, generating a first feedback signal, wherein the first feedback signal is representative of a phase of the output signal relative to the reference clock signal;
   based on the first feedback signal, generating a second feedback signal, wherein generating the second feedback signal comprises, in response to the second frequency being an integer multiple of the first frequency, modifying the first feedback signal by forcing a least significant bit (LSB) of the first feedback signal to be maintained at a specific value to generate the second feedback signal, wherein the LSB in the second feedback signal is maintained at the specific value irrespective of a value of the LSB of the first feedback signal; and
   based on the second feedback signal, generating a control signal, wherein the output signal is generated by the digitally controlled oscillator based on the control signal.

2. The method of claim 1, wherein generating the second feedback signal further comprises:
   receiving a mode signal that is indicative of an operational mode of the digitally controlled oscillator; and
   in response to the mode signal, generating the second feedback signal.

3. The method of claim 1, wherein:
   the phase of the output signal relative to the reference clock signal has (i) an integer component and (ii) a decimal component; and
   the first feedback signal is representative of the decimal component of the phase of the output signal relative to the reference clock signal.

4. The method of claim 1, further comprising:
   generating, by a time to digital converter, a count value, wherein the count value represents a number of time delays between a rising edge of the output signal and a rising edge of the reference clock signal; and
   generating the first feedback signal by multiplying the count value by each of (i) an amount of the time delay and (ii) a frequency of the output signal.

5. The method of claim 1, wherein modifying the first feedback signal further comprises:
   in response to the second frequency being an integer multiple of the first frequency, modifying the first feedback signal to generate the second feedback signal such that a dead zone effect in the digitally controlled oscillator is eliminated.

6. A method comprising:
   receiving a reference clock signal;
   generating, by a digitally controlled oscillator, an output signal, wherein the reference clock signal has a first frequency, and wherein the digitally controlled oscillator is configured to generate the output signal at a second frequency;
   based on the output signal, generating a first feedback signal, wherein the first feedback signal is representative of a phase of the output signal relative to the reference clock signal;
   based on the first feedback signal, generating a second feedback signal, wherein generating the second feedback signal comprises
     (i) in response to the second frequency being an integer multiple of the first frequency, modifying the first feedback signal to generate the second feedback signal, and
     (ii) in response to the second frequency being a non-integer multiple of the first frequency, refraining from modifying the first feedback signal while generating the second feedback signal such that the first feedback signal is equal to the second feedback signal; and
   based on the second feedback signal, generating a control signal, wherein the output signal is generated by the digitally controlled oscillator based on the control signal.

7. The method of claim 6, wherein an average feedback signal results in the output signal being generated at substantially the second frequency, and wherein generating the second feedback signal further comprises, in response to the second frequency being an integer multiple of the first frequency:
   generating the second feedback signal such that the second feedback signal is not equal to the average feedback signal at a specific time instance; and
   forcing the average value of the second feedback signal, over a plurality of clock cycles of the reference clock signal, to the average feedback signal.

8. A method comprising:
   receiving a reference clock signal;
   generating, by a digitally controlled oscillator, an output signal, wherein the reference clock signal has a first frequency, and wherein the digitally controlled oscillator is configured to generate the output signal at a second frequency,
   based on the output signal, generating a first feedback signal, wherein the first feedback signal is representative of a phase of the output signal relative to the reference clock signal;
   based on the first feedback signal, generating a second feedback signal, wherein an average feedback signal results in the output signal being generated at substantially the second frequency, and wherein generating the second feedback signal further comprises
     in response to the second frequency being an integer multiple of the first frequency, modifying the first feedback signal by forcing a least significant bit (LSB) of the first feedback signal to 1 to generate the second feedback signal; and based on the second feedback signal, generating a control signal, wherein the output signal is generated by the digitally controlled oscillator based on the control signal, and wherein the control signal is generated such that a least significant bit of the average feedback signal has a value of 0.

9. A method comprising:

receiving a reference clock signal;

generating, by a digitally controlled oscillator, an output signal, wherein the reference clock signal has a first frequency, and wherein the digitally controlled oscillator is configured to generate the output signal at a second frequency;

based on the output signal, generating a first feedback signal, wherein the first feedback signal is representative of a phase of the output signal relative to the reference clock signal;

based on the first feedback signal, generating a second feedback signal, wherein an average feedback signal results in the output signal being generated at substantially the second frequency, and wherein generating the second feedback signal further comprises in response to the second frequency being an integer multiple of the first frequency, modifying the first feedback signal by forcing a least significant bit of the first feedback signal to 0 to generate the second feedback signal; and based on the second feedback signal, generating a control signal, wherein the output signal is generated by the digitally controlled oscillator based on the control signal, and wherein the control signal is generated such that a least significant bit of the average feedback signal has a value of 1.

10. A system configured to receive a reference clock signal, the system comprising:

a digitally controlled oscillator configured to generate an output signal, wherein the reference clock signal has a first frequency, and wherein the digitally controlled oscillator is configured to generate the output signal at a second frequency; and a digital processor comprising (i) a feedback modification module and (ii) a control module, wherein the feedback modification module is configured to receive a first feedback signal, wherein the first feedback signal is representative of a phase of the output signal relative to the reference clock signal, and based on the first feedback signal, generate a second feedback signal, wherein the feedback modification module is configured to generate the second feedback signal by in response to the second frequency being an integer multiple of the first frequency, modifying the first feedback signal by forcing a least significant bit (LSB) of the first feedback signal to a specific value to generate the second feedback signal, wherein the LSB in the second feedback signal is maintained at the specific value irrespective of a value of the LSB of the first feedback signal, and wherein the control module is configured to, based on the second feedback signal, generate a control signal, wherein the digitally controlled oscillator is configured to generate the output signal based on the control signal.

11. The system of claim 10, wherein the feedback modification module is further configured to generate the second feedback signal by:

receiving a mode signal that is indicative of an operational mode of the digitally controlled oscillator; and in response to the mode signal, generating the second feedback signal.

12. The system of claim 10, wherein:

the phase of the output signal relative to the reference clock signal has (i) an integer component and (ii) a decimal component; and the first feedback signal is representative of the decimal component of the phase of the output signal relative to the reference clock signal.

13. A system configured to receive a reference clock signal, the system comprising:

a digitally controlled oscillator configured to generate an output signal, wherein the reference clock signal has a first frequency, and wherein the digitally controlled oscillator is configured to generate the output signal at a second frequency; and a digital processor comprising (i) a feedback modification module and (ii) a control module, wherein the feedback modification module is configured to:

receive a first feedback signal, wherein the first feedback signal is representative of a phase of the output signal relative to the reference clock signal, and based on the first feedback signal, generate a second feedback signal, wherein the feedback modification module is configured to generate the second feedback signal by (i) in response to the second frequency being an integer multiple of the first frequency, modifying the first feedback signal to generate the second feedback signal, and (ii) in response to the second frequency being a non-integer multiple of the first frequency, refraining from modifying the first feedback signal while generating the second feedback signal such that the first feedback signal is equal to the second feedback signal, and wherein the control module is configured to, based on the second feedback signal, generate a control signal, wherein the digitally controlled oscillator is configured to generate the output signal based on the control signal.

14. The system of claim 13, wherein an average feedback signal results in the output signal being generated at substantially the second frequency, and wherein the feedback modification module is further configured to generate the second feedback signal by:

in response to the second frequency being an integer multiple of the first frequency, generating the second feedback signal such that the second feedback signal is not equal to the average feedback signal at a specific time instance.

15. A system configured to receive a reference clock signal, the system comprising:

a digitally controlled oscillator configured to generate an output signal, wherein the reference clock signal has a first frequency, and wherein the digitally controlled oscillator is configured to generate the output signal at a second frequency; and a digital processor comprising (i) a feedback modification module and (ii) a control module, wherein the feedback modification module is configured to:

receive a first feedback signal, wherein the first feedback signal is representative of a phase of the output signal relative to the reference clock signal, and based on the first feedback signal, generate a second feedback signal, wherein the control module is configured to, based on the second feedback signal, generate a control signal, wherein the digitally controlled oscillator is configured to generate the output signal based on the control signal, wherein the control signal is generated such that a least significant bit of the average feedback signal has a value of 0, and wherein the feedback modification module is further configured to generate the second feedback signal by:

in response to the second frequency being an integer multiple of the first frequency, modifying the first feedback signal by forcing an LSB of the first feedback signal to 1 to generate the second feedback signal.

16. A system configured to receive a reference clock signal, the system comprising:

a digitally controlled oscillator configured to generate an output signal, wherein the reference clock signal has a first frequency, and wherein the digitally controlled oscillator is configured to generate the output signal at a second frequency; and a digital processor comprising (i) a feedback modification module and (ii) a control module, wherein the feedback modification module is configured to:

receive a first feedback signal, wherein the first feedback signal is representative of a phase of the output signal relative to the reference clock signal, and based on the first feedback signal, generate a second feedback signal, wherein the control module is configured to, based on the second feedback signal, generate a control signal, wherein the digitally controlled oscillator is configured to generate the output signal based on the control signal, wherein the control signal is generated such that a least significant bit of the average feedback signal has a value of 0, and wherein the feedback modification module is further configured to generate the second feedback signal by:

in response to the second frequency being an integer multiple of the first frequency, modifying the first feedback signal by forcing an LSB of the first feedback signal to 0 to generate the second feedback signal.

17. A system configured to receive a reference clock signal, the system comprising:

a digitally controlled oscillator configured to generate an output signal, wherein the reference clock signal has a first frequency, and wherein the digitally controlled oscillator is configured to generate the output signal at a second frequency;

a digital processor comprising (i) a feedback modification module and (ii) a control module, wherein the feedback modification module is configured to:

(A) receive a first feedback signal, wherein the first feedback signal is representative of a phase of the output signal relative to the reference clock signal, and (B) based on the first feedback signal, generate a second feedback signal, wherein the feedback modification module is configured to generate the second feedback signal by in response to the second frequency being an integer multiple of the first frequency, modifying the first feedback signal by forcing a least significant bit (LSB) of the first feedback signal to a specific value to generate the second feedback signal, wherein the control module is configured to, based on the second feedback signal, generate a control signal, wherein the digitally controlled oscillator is configured to generate the output signal based on the control signal; and a time to digital converter configured to generate a count value, wherein the count value represents a number of time delays between a rising edge of the output signal and a rising edge of the reference clock signal, and wherein the digital processor is configured to generate the first feedback signal by multiplying the count value by each of (i) an amount of the time delay and (ii) a frequency of the output signal.

18. A system configured to receive a reference clock signal, the system comprising:

a digitally controlled oscillator configured to generate an output signal, wherein the reference clock signal has a first frequency, and wherein the digitally controlled oscillator is configured to generate the output signal at a second frequency;

a digital processor comprising (i) a feedback modification module and (ii) a control module, wherein the feedback modification module is configured to:

(A) receive a first feedback signal, wherein the first feedback signal is representative of a phase of the output signal relative to the reference clock signal, and (B) based on the first feedback signal, generate a second feedback signal, wherein the feedback modification module is configured to generate the second feedback signal by in response to the second frequency being an integer multiple of the first frequency, modifying the first feedback signal by forcing a least significant bit (LSB) of the first feedback signal to a specific value to generate the second feedback signal, wherein the control module is configured to, based on the second feedback signal, generate a control signal, wherein the digitally controlled oscillator is configured to generate the output signal based on the control signal, and wherein the feedback modification module is configured to modify the first feedback signal such that a degradation of noise performance of the digitally controlled oscillator, due to a dead zone effect caused by a finite resolution of a time-to-digital converter, is eliminated.

* * * * *